United States Patent [19]

Hsiao et al.

[11] 3,947,778

[45] Mar. 30, 1976

[54] DIFFERENTIAL AMPLIFIER

[75] Inventors: Perng Hsiao; Fuad H. Musa, both of Tempe, Ariz.

[73] Assignee: Motorola, Inc., Chicago, Ill.

[22] Filed: Sept. 11, 1974

[21] Appl. No.: 505,101

[52] U.S. Cl.................. 330/30 D; 307/279; 330/22; 330/35
[51] Int. Cl.² ......................................... H03F 3/68
[58] Field of Search .... 307/279, 304; 330/22, 30 D, 330/35, 69

[56] References Cited
UNITED STATES PATENTS

| | | | |
|---|---|---|---|
| 3,569,849 | 3/1971 | Cassidy | 330/30 D X |
| 3,581,226 | 5/1971 | Perkins | 330/30 D |
| 3,660,773 | 5/1972 | Free | 330/30 D |
| 3,667,063 | 5/1972 | Boyd et al. | 330/30 D X |
| 3,852,679 | 12/1974 | Schade, Jr. | 330/30 D |

*Primary Examiner*—R. V. Rolinec
*Assistant Examiner*—Lawrence J. Dahl
*Attorney, Agent, or Firm*—Harry M. Weiss; Charles R. Hoffman

[57] ABSTRACT

A family of differential amplifiers are described which utilize only MOSFET transistors as the active devices. These amplifiers exhibit an infinite input impedance and zero input offset and bias currents. The circuits are capable of operating over a wide range of DC supply voltages at extremely low DC current drain. A differential amplifier is shown which operates from a single positive DC supply voltage and which handles a wide range of input common mode voltage swings including some negative common mode voltages. Another amplifier is shown which operates from a combination of a single positive and a single negative supply voltage and which handles a wide range of positive and negative input common mode voltage swings.

17 Claims, 14 Drawing Figures

DIFFERENTIAL AMPLIFIER

BACKGROUND OF THE INVENTION

Differential amplifiers typically utilize bipolar transistors for active devices. It is characteristic of such amplifiers to have relatively low input impedance and high input offset and bias currents. In order to overcome these problems, some amplifiers utilize either junction-field effect transistors or MOS field effect transistors for the input devices. The remaining transistors in the circuit are bipolar transistors, either NPN or PNP. These circuits require complex fabrication processes which are capable of monolithically integrating the different types of transistors in the same circuit. When operated from a single positive supply voltage, such amplifiers exhibit poor operation as the input common mode voltage approaches ground. Also, a typical one of these circuits cannot operate with a negative input common mode voltage.

In using the techniques described in greater detail hereinafter, it is possible to design a complete differential amplifier using only MOSFETs. No other type of components is needed in one such configuration. Another advantage of a MOSFET differential amplifier over existing differential amplifiers is the extremely large input impedance which is characteristic of the gate to source impedance of MOSFETs. Since The MOSFET is a voltage driven device as contrasted to bipolar transistors which are current driven devices, extremely low offset and bias currents can be realized using MOSFETs for input transistors. A MOSFET differential amplifier exhibits leakage current lying in the range of pico amps rather than in the range of nano amps as found in bipolar amplifiers.

With proper control of the threshold voltages of both the P and N-channel transistors, a CMOS differential amplifier operates with an extremely large input common mode voltage swing. When such an amplifier operates from a single positive supply voltage, it can operate with negative input common mode voltage signals. Such as operating mode cannot be easily obtained from bipolar amplifiers since $V_{BE}$ of both the NPN and PNP transistors is virtually equal.

Another advantage of a CMOS differential amplifier is that true complementary symmetry can be obtained with a CMOS integrated circuit, while true complementary symmetry cannot be obtained when using bipolar transistors. It is common knowledge that good PNP transistors cannot be made in the same process as good NPN transistors. However, a good P-channel device can be made in the same process as a good N-channel device. Although a MOSFET device is considerably smaller than a bipolar transistor, comfortable gains are obtainable from these CMOS differential amplifiers system due to the low capacitance of the MOSFET.

The CMOS differential amplifiers which are described in this invention utilize MOSFETs for active loads. This characteristic offers the following advantages:

a. It makes it possible to design a differential amplifier with MOSFETs being the only components used.

b. It provides large load impedances and, hence, large voltage gain with relatively small chip area by increasing gate width(s) and operating the load devices in the saturation region.

c. Utilizing the MOS process technology, active devices can be fabricated to have a better match than passive components such as resistors. Therefore, using MOSFETs for active loads improves the input offset voltage characteristics of the differential amplifier. Since large load impedances are realized in small chip areas, low parasitic capacitances are associated with these loads which increases the amplifier's slewing rate.

d. Input common-mode voltage swing can be improved by controlling the threshold voltages of the load devices.

A relatively high initial input offset voltage is characteristic of a CMOS differential amplifier as compared to a low input offset voltage as being characteristic of a bipolar differential amplifier. Statistical data obtained on recently integrated CMOS differential amplifiers have shown that input offset voltage drift with temperature is as good as those obtained from some bipolar transistors.

An additional advantage of CMOS amplifier over a bipolar amplifier is the fact that CMOS amplifiers can be biased at extremely low drain currents without appreciable affecting the voltage gain of the amplifier. It is not unusual that a CMOS differential amplifier is operated at a 1 to 10 micro amp level and still obtain a gain in the order of 20 to 40 dB.

Various designs of CMOS differential amplifiers are described hereinafter that can be operated from either a single positive supply voltage or a single negative power supply voltage. It is possible to design a monolithically integral CMOS differential amplifier that can offer an extremely low power drain level and/or an extremely wide range of supply voltages.

SUMMARY OF THE INVENTION

This invention relates to a family of differential amplifiers, and more particularly it relates to a family of differential amplifier circuits using only silicon gate or metal gate MOSFET transistors as the active devices.

It is an object of the present invention to provide a family of differential amplifier circuits having a virtually infinite input impedance and zero input offset and bias currents.

It is another object of this invention to provide a family of differential amplifier configurations which are capable of operating within a wide range of DC supply voltages at extremely low DC current flow.

Another object of the present invention is to provide a family or differential amplifier circuits in which all of the components are manufacturable through complementary MOSFET monolithic integration processes.

A still further object of the present invention is to provide a family of differential amplifier circuits which are capable of operating from a single positive DC supply voltage while maintaining excellent operation over a wide range of input common mode voltage swings, including operation with negative input common mode voltages.

It is another object of the present invention to provide a family of differential amplifiers which can be supplied from a combination of a single positive DC voltage with a single negative DC voltage with operation over a wide positive and negative input common mode voltage swing.

A further object of the present invention is to provide a differential amplifier which is capable of operating from a single negative DC supply voltage which operates over a range of positive input common mode voltage swings.

Another object of the present invention is to provide a family of differential amplifiers which operate with a combination of a single positive and a single negative supply voltage, and which operate over a wide range of positive and negative input common mode voltage swings.

It is an object of this invention to utilize MOSFETs having a large impedance between its drain and source terminals and having a drain to source current independent of drain to source voltage as the constant current source in all differential amplifier configurations.

A still further object of this invention is to provide a differential amplifier capable of having either a differential or a single ended output.

These and other objects and features of this invention will become fully apparent in the following description of the accompanying drawings herein:

DESCRIPTION OF THE DRAWINGS

FIG. 1a is a circuit diagram designation of a P-channel MOSFET;

FIG. 1b is a circuit diagram designation of an N-channel MOSFET;

DETAILED DESCRIPTION OF THE INVENTION

Throughout the several Figures, the same numeral is used to identify the same component.

Referring to FIG. 1a, there is shown a P-channel MOS field effect transistor. The P-channel device operates in substantially the same way as the N-channel device. This transistor conducts current between its source and drain, when the following two conditions are satisfied: First, the drain is at a negative potential with respect to the source; and second, the gate is at a negative potential with respect to the source and this gate to source potential should exceed in magnitude a certain voltage called a threshold voltage of this device.

Referring to FIG. 1b, there is shown an N-channel MOS field effect transistor. The transistor conducts current between its drain and source, when the following two conditions are satisfied: First, the drain is at a positive potential with respect to the source; and second, the gate to source potential is positive and the gate to substrate voltage exceeds a certain voltage called a threshold voltage of that N-channel device.

The family of differential amplifiers described hereinafter comprise (a) a bias network, (b) an input stage, (c) a current source, and (d) a load configuration.

An ideal constant current source provides a current which is independent of the voltage drop across its terminals.

Figure 2:
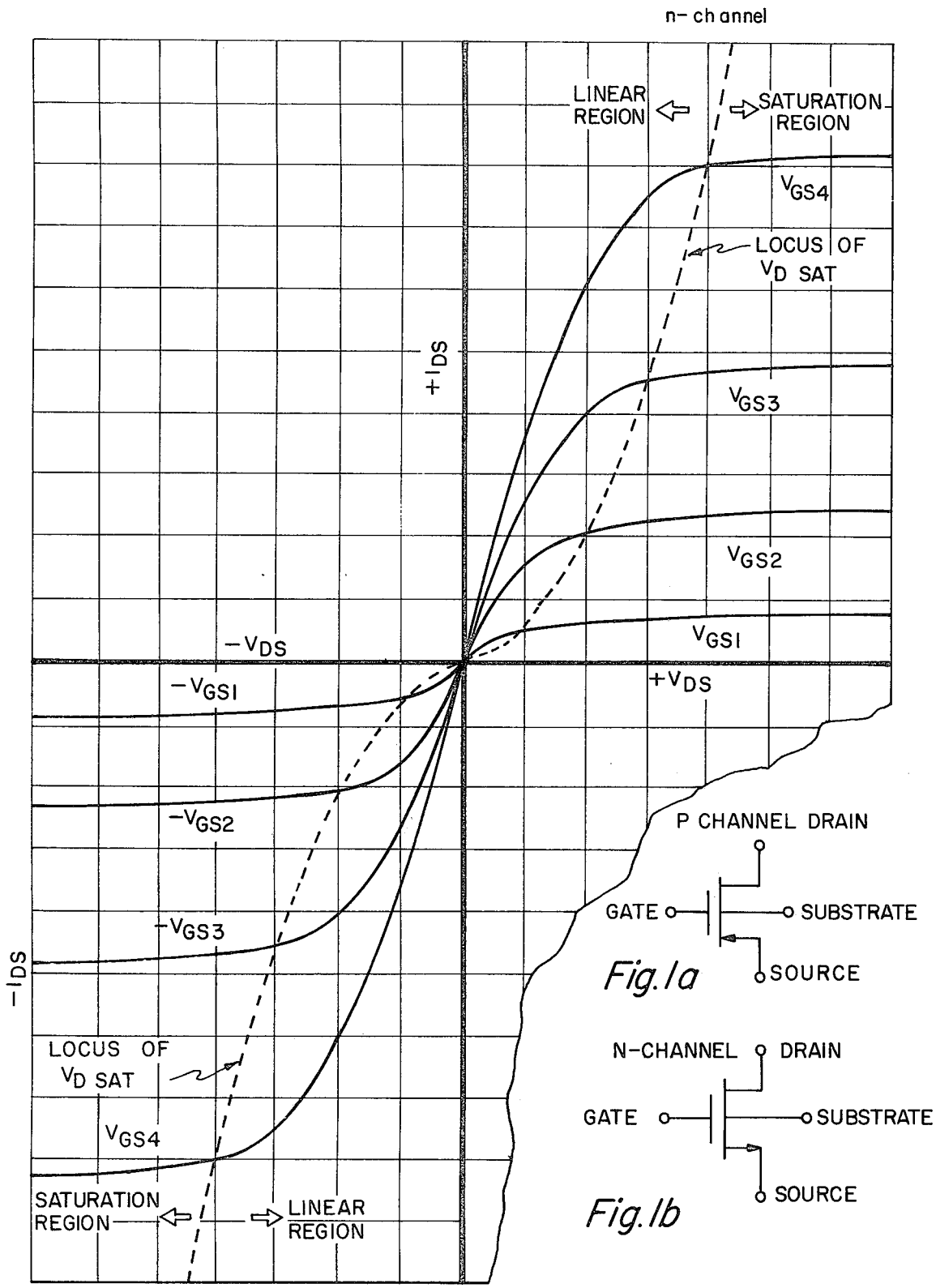
FIG. 2 shows a typical current-voltage relationship of N- and P-channel MOSFETs.

Reference is made to the typical MOSFET I–V relationships shown in FIG. 2. It is clear that in the saturation region, the drain-source terminals of the MOSFET provide near ideal current source. This is due to the fact that the drain to source current remains virtually constant as the drain to source voltage is varied. The magnitude of the current can be controlled, however, by adjusting the gate to source voltage. In the amplifier configurations embodied in this invention, the drain to source terminals of a MOSFET are utilized for a constant current source whose magnitude is adjusted by varying the gate to source voltage.

In order to guarantee a MOSFET operation in the saturation region, the drain to source voltage should exceed a minimum value which is equal to the saturation voltage ($V_{DSAT}$) which is approximately equal to $V_{GS} - V_T$ where $V_{GS}$ is the gate-to-source voltage and $V_T$ is the threshold voltage which is controlled by such process parameters as impurity concentration, oxide thickness, flat band voltage, and surface trap density at the interface between gate oxide and the silicon in the channel region, etc.

For an ideal circuit source operation $V_{DSAT}$ must be minimized to allow operation at low drain to source voltages. Also, to allow ideal current source operation at large drain to source voltages, the drain to source breakdown voltage must be maximized.

In this context, the DC bias network is that which provides the proper DC currents and voltages to the rest of the differential amplifier specifically the current source.

The bias network should: 1) insure that all MOSFETs in the differential amplifier, including current source, input, and load MOSFETs, operate in the proper mode of operation (all MOSFETs must operate in the saturation region); 2) allow for adjustment of total DC current drain; 3) allow proper operation over a wide range of temperature; 4) allow proper operation with process variations; 5) allow for a wide range of input common mode voltage swing; 6) allow proper operation over a wide range of DC supply voltages; and 7) provide a means of input voltage offset adjustment.

A suitable input stage should provide: 1) an infinite input impednace, 2) a zero input bias and offset currents, 3) a zero input offset voltage, 4) a relatively large voltage gain, i.e., greater than 20 db, 5) a low input noise characteristic, 6) a high slew rate, and 7) and a large input common mode voltage.

The characteristic of MOSFETs is the large gate to source impedance. Therefore, a MOSFET operating in common mode configuration can be utilized effectively as an input transistor in a differential amplifier stage to provide an extremely large input impedance which is diminished only by gate oxide leakage current. Thus, leakage and input currents in the pico-amp region can be achieved. This provides several orders of magnitude reduction in input offset and bias current characteristics as compared to the existing bipolar differential amplifier, i.e., pico-amps rather than at best nano-amps.

Large gains can be obtained by maximizing the gate width to length ratio of the input MOSFETs, higher Z/L results in higher Gm, and by utilizing MOSFETs for active loads to provide the necessary large load impedances. This can be done with small load parasitic capacitance, thus, enhancing the slewing rate of the differential amplifier.

Also, by properly controlling the N-channel and the p-channel MOSFET threshold voltages, a wide range of input common mode voltage swings can be obtained. Also, negative input common mode voltage operations can be obtained even when the differential amplifier is supplied from a single positive DC voltage. This is an advantage over bipolar amplifiers since the $V_{BE}$ drop is almost the same for NPN and PNP transistors.

Figure 3:
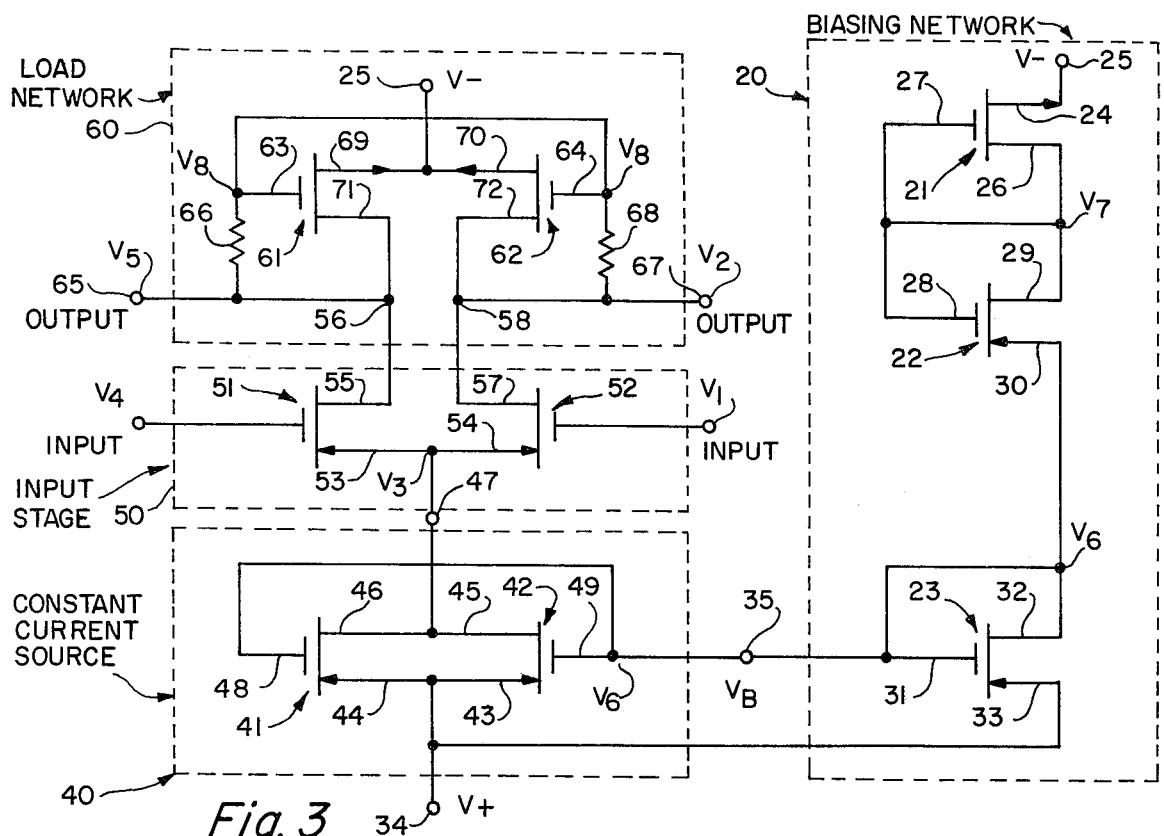
FIG. 3 shows a differential amplifier with a balanced output.

Referring to FIG. 3, there can be seen a schematic view of a first differential amplifier made according to the teaching of the present invention. Each of the differential amplifiers include a biasing means such as a biasing network 20 as shown in FIG. 3. A typical differential amplifier also includes a constant current source 40, an input stage 50, and a load network 60.

The biasing network comprises a plurality of transistors 21, 22 and 23 and each include a source, drain and gate electrode. A source electrode 24 of the transistor 21 is connected to the minus voltage supply 25. A drain electrode 26 of the transistor 21 is connected to a voltage node $V_7$ and to a gate electrode 27 of the same transistor 21 as well as a gate electrode 28 and a drain electrode 29, respectively, of the transistor 22. The source electrode 30 of the transistor 22 is connected to a voltage node $V_6$ and to a gate electrode 31 and a drain electrode 32, respectively, of the transistor 23. A source electrode 33 of the transistor 23 is connected to the positive supply voltage indicated at a terminal 34. The gate electrode 31 of the transistor 23 provides the biasing voltage $V_B$ to the remaining portion of the differential amplifier at a biasing terminal 35.

The constant current source 40 comprises a pair of transistors 41 and 42 and each have source, drain and gate electrodes. A source electrode 43 of the transistor 42 is connected to a source electrode 44 of the transistor 41 and the common connection is connected to the positive voltage supply 34. A drain electrode 45 of the transistor 42 is connected to a drain electrode 46 of the transistor 41, and the common connection is connected to a constant current input connection 47 of the load network 60. A gate electrode 48 of the transistor 41 is connected to a gate electrode 49 of the transistor 42.

The input stage 50 comprises a pair of transistors 51 and 52 and each have a source, drain and gate electrode. A source electrode 53 of the transistor 51 is connected to a source electrode 54 of the transistor 52 and, the common connection is connected to the current input connection 47. A drain electrode 55 of the transistor 51 is connected to a junction 56 and the drain electrode 57 of the transistor 52 is connected to a junction 58.

The load network 60 comprises a pair of transistor 61 and 62 and each have source, drain and gate electrodes. A gate electrode 63 of a transistor 61 is connected to a gate electrode 64 of the transistor 62. The gate electrode 63 is also connected to a first output terminal 65 by a resistor 66. The gate electrode 64 of the transistor 62 is connected to a second output terminal 67 by a resistor 68. A source terminal 69 of the transistor 61 is connected to a source terminal 70 of the transistor 62 and, the common connection is connected to a source of negative potential indicated at 25. A drain electrode 71 of the transistor 61 is connected to the junction 56 and, a drain electrode 72 of the transistor 62 is connected to the junction 58.

Figure 4:
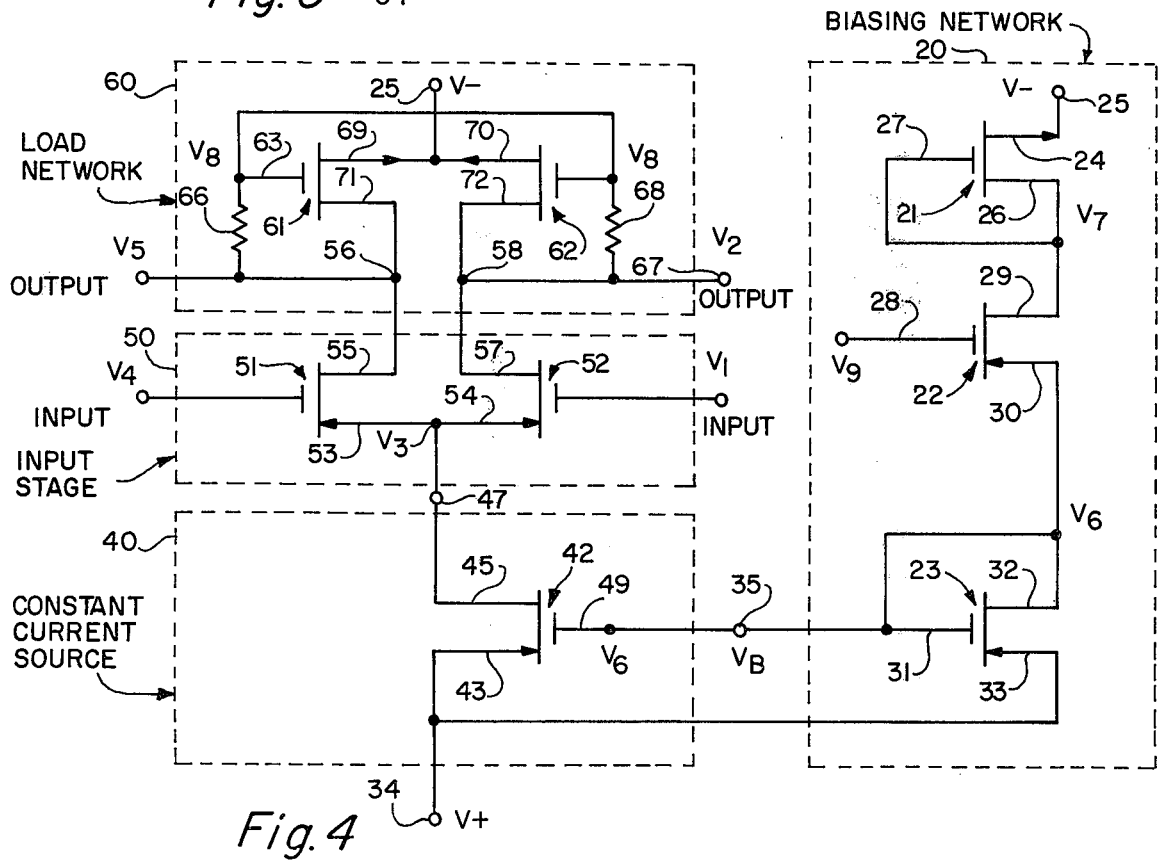
FIG. 4 shows the differential amplifier of FIG. 3 with an additional provision of DC current and offset-voltage adjustments.

The differential amplifier circuit shown in FIG. 4 is the same as that shown in FIG. 3 except that the transistor 41 and its source, drain and gate electrodes 44, 46 and 48 are eliminated from the circuit. Additionally, the gate electrode 28 of the transistor 22 is now connected to a terminal identified as $V_9$. The remaining elements are numbered as before.

Figure 5:
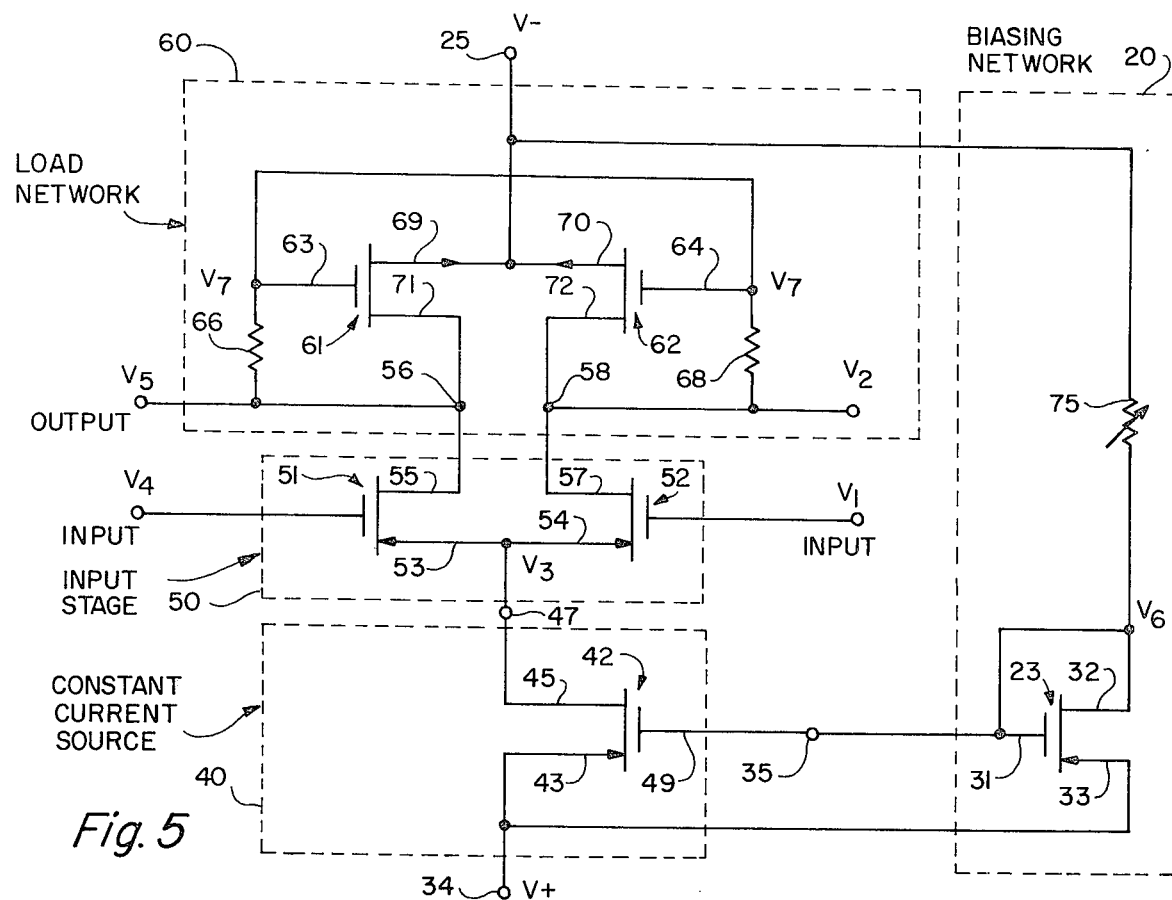
FIG. 5 shows the differential amplifier of FIG. 3 with a bias network consisting of one resistor and one P-channel MOSFET.

The differential amplifier shown in FIG. 5 is the same as that shown in FIG. 4 except for the elimination of transistors 21 and 22 and their replacement by a variable resistor 75 having one end connected to the voltage supply 25 and having its second end connected to the drain 32 of the transistor 23.

Figure 6:
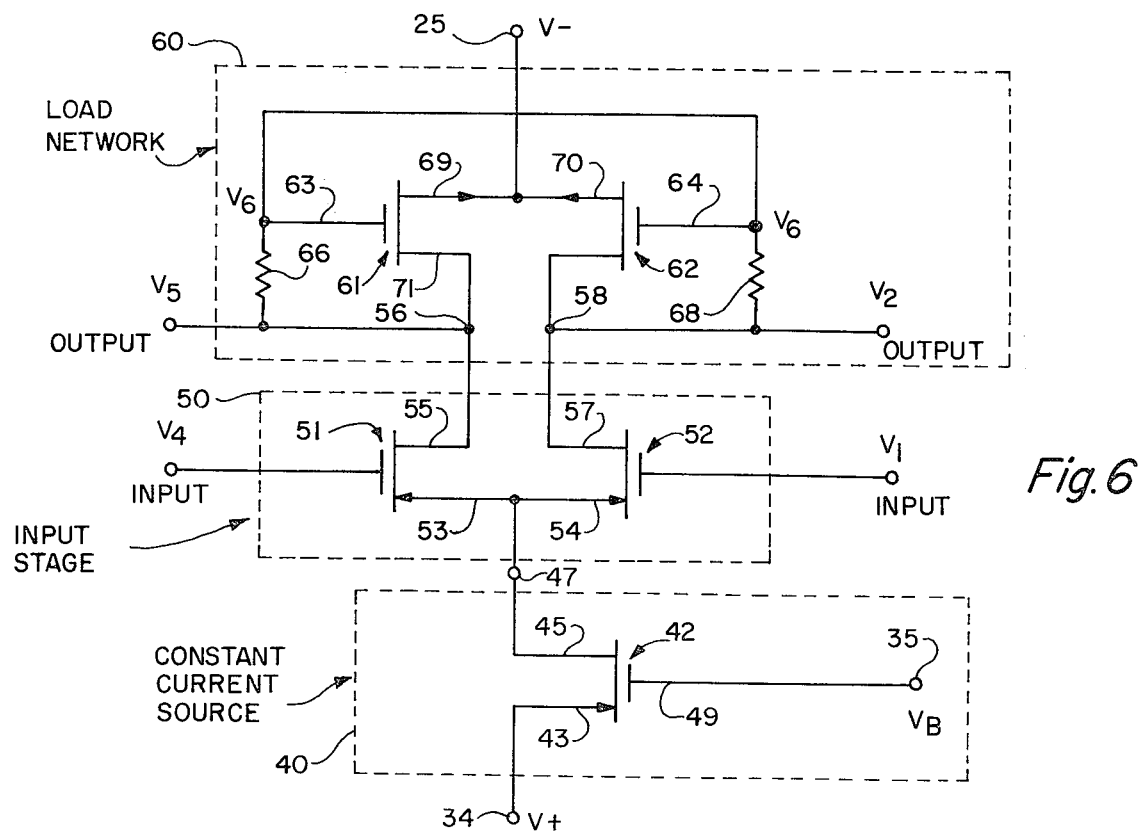
FIG. 6 shows a differential amplifier with the DC bias voltage being applied to the gate of the current-source MOSFET.

The differential amplifier shown in FIG. 6 is the same as that shown in FIG. 5 except for the entire elimination of a biasing network 20. Any suitable biasing circuit can be connected to the input biasing terminal 35.

Figure 7:
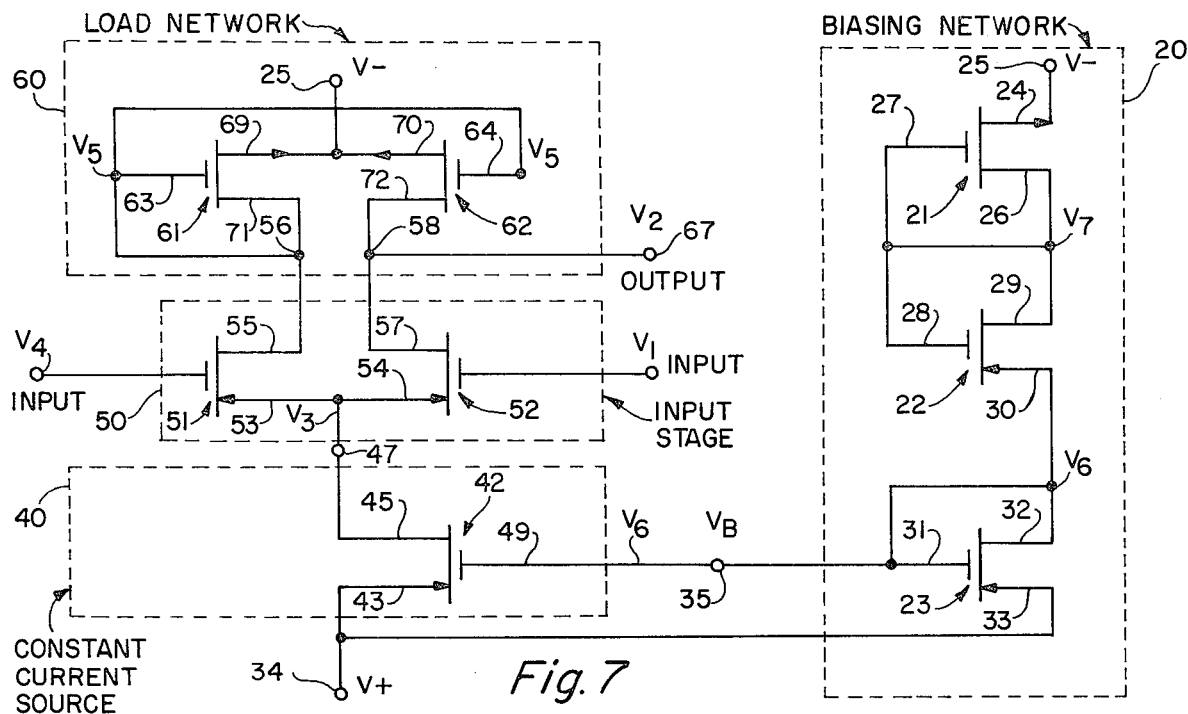
FIG. 7 shows a differential amplifier with an unbalanced output.

The differential amplifier shown in FIG. 7 is the same as shown in FIG. 3 except for the elimination of the resistors 66 and 68, and of the transistor 41 as described with reference to FIG. 4 and the elimination of the first output terminal 65. The gate electrode 63 of the transistor 61 is now connected directly to the junction 56.

Figure 8:
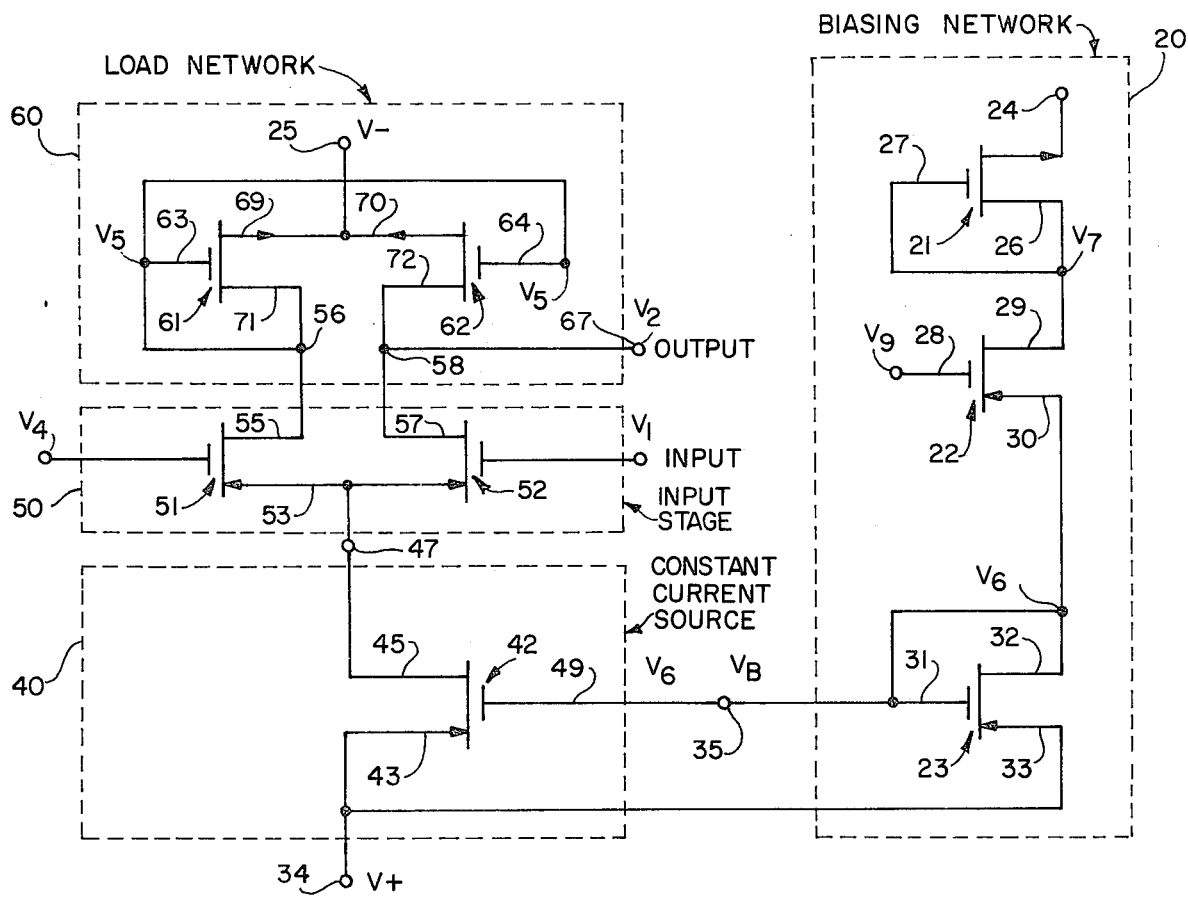
FIG. 8 shows the differential amplifier of FIG. 7 which provides for DC current and offset voltage adjustments.

The differential amplifier as shown in FIG. 8 is the same as that shown in FIG. 4 except for the elimination of the resistors 66 and 68 and, the elimination of the first output terminal 65. The gate electrode 63 of the transistor 61 is now connected directly to the junction 56.

Figure 9:
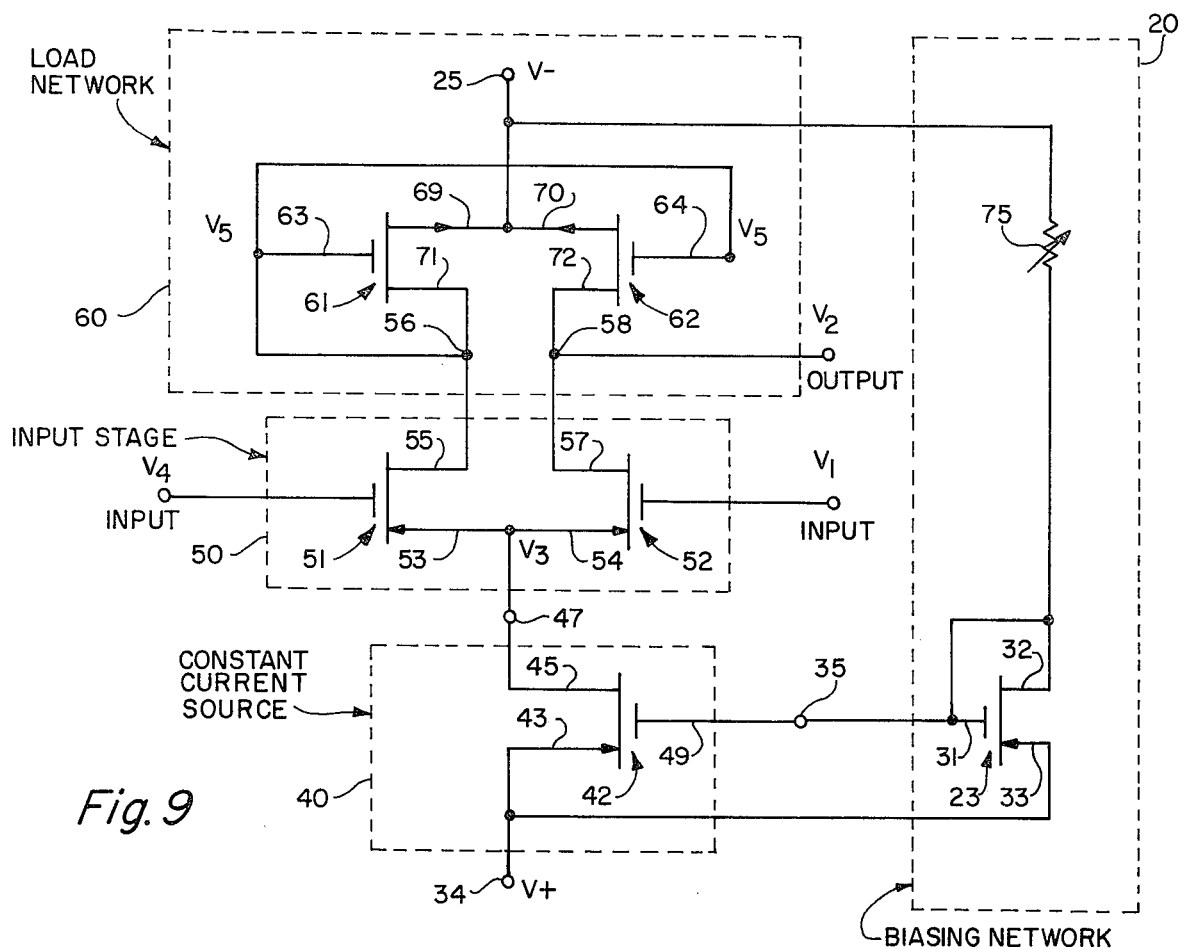
FIG. 9 shows the differential amplifier of FIG. 7 with a DC bias voltage network consisting of one resistor and one P-channel MOSFET.

The differential amplifier shown in FIG. 9 is the same as that shown in FIG. 5 except for the elimination of the resistors 66 and 68, and the elimination of the first output terminal 65. The gate electrode 63 of the transistor 61 is now connected directly to the junction 56.

Figure 10:
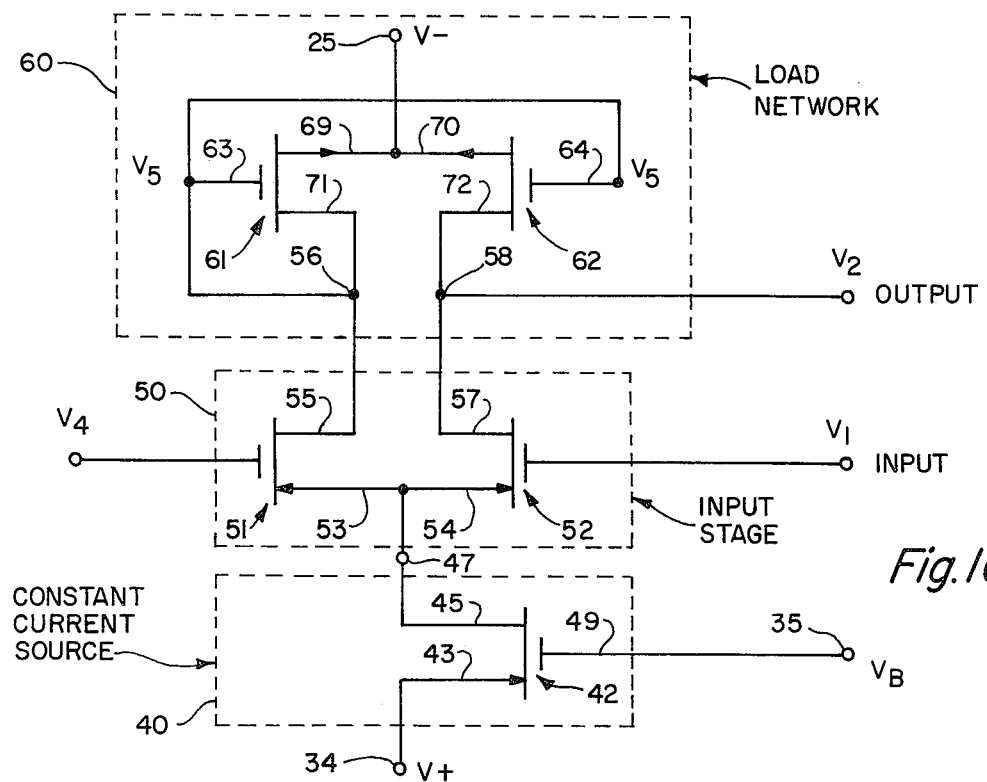
FIG. 10 shows the differential amplifier of FIG. 7 with an unbalanced output configuration in which the DC bias is applied to the gate of the current source MOSFET.

The differential amplifier shown in FIG. 10 is the same as that shown in FIG. 6 except for the elimination of the resistors 66 and 68 and the elimination of the first output terminal 65. The gate electrode 63 of the transistor 61 is now connected directly to the junction 56.

Figure 11:
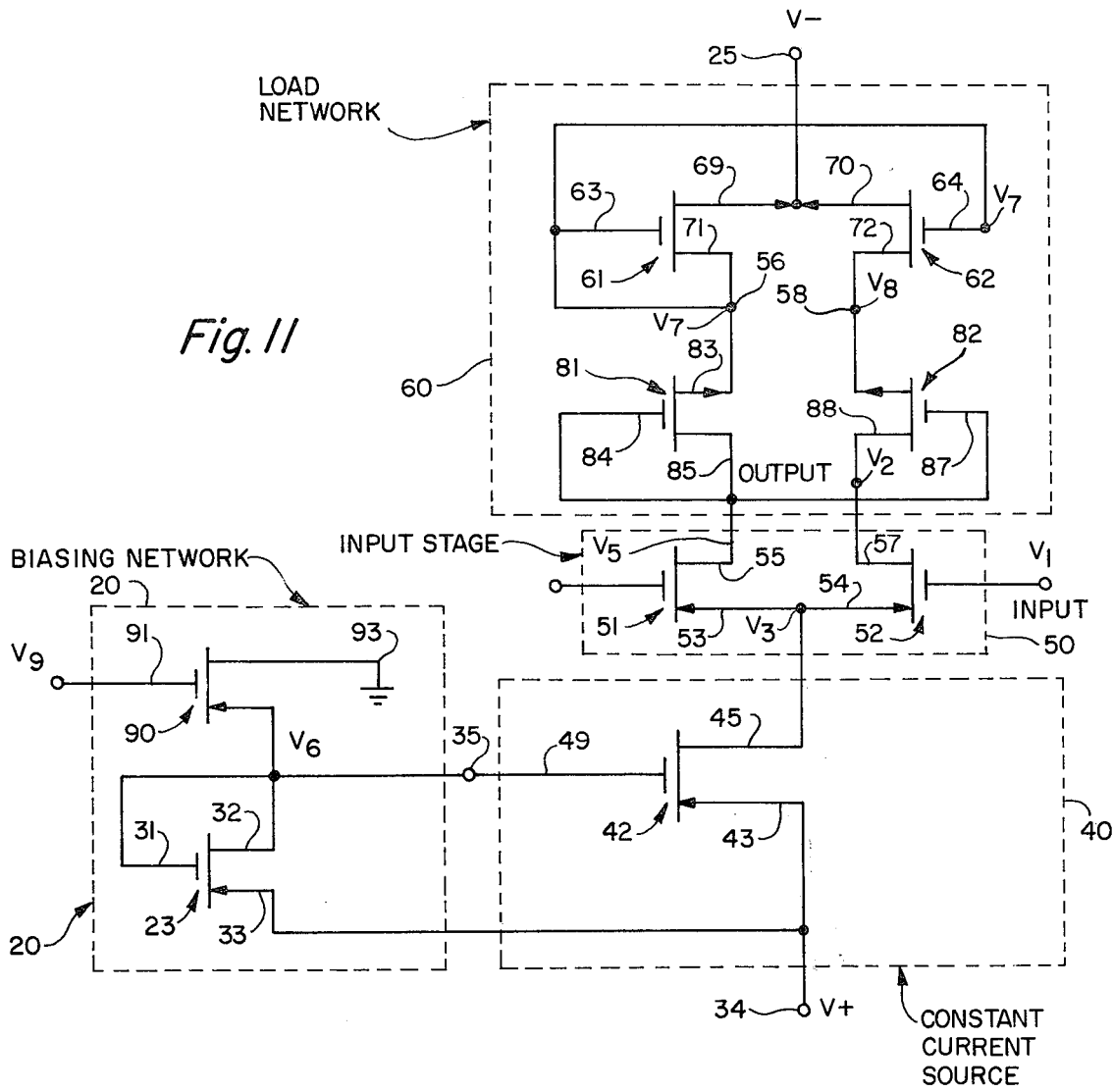
FIG. 11 shows the differential amplifier of FIG. 10 in which the DC bias voltage is applied directly to the gate of the current-source MOSFET.

The differential amplifier shown in FIG. 11 is the same as that shown in FIG. 7 except for the additional of a pair of transistors 81 and 82 intermediate the transistor pairs 51 and 61 and 52 and 62, respectively, and for the elimination of the transistor 22 in the biasing network 20. The trnsistor 81 has a source electrode 83 connected to the junction 56, a gate electrode 84 connected to a drain electrode 85 and the common connection connected to the drain 55 of the transistor 51. The transistor 82 has a source electrode 86 connected to the junction 58, a gate electrode 87 connected to a drain electrode 88, and the common connection connected to the drain 57 of the transistor 52.

The junction $V_6$ at the common connection of the gate 31 and the drain 32 of the transistor 23 is connected to a source electrode 89 of a P-channel transistor 90 having drain and gate electrodes. A gate electrode 91 is connected to a terminal $V_9$, and a drain electrode 92 is connected to ground 93.

Figure 12:
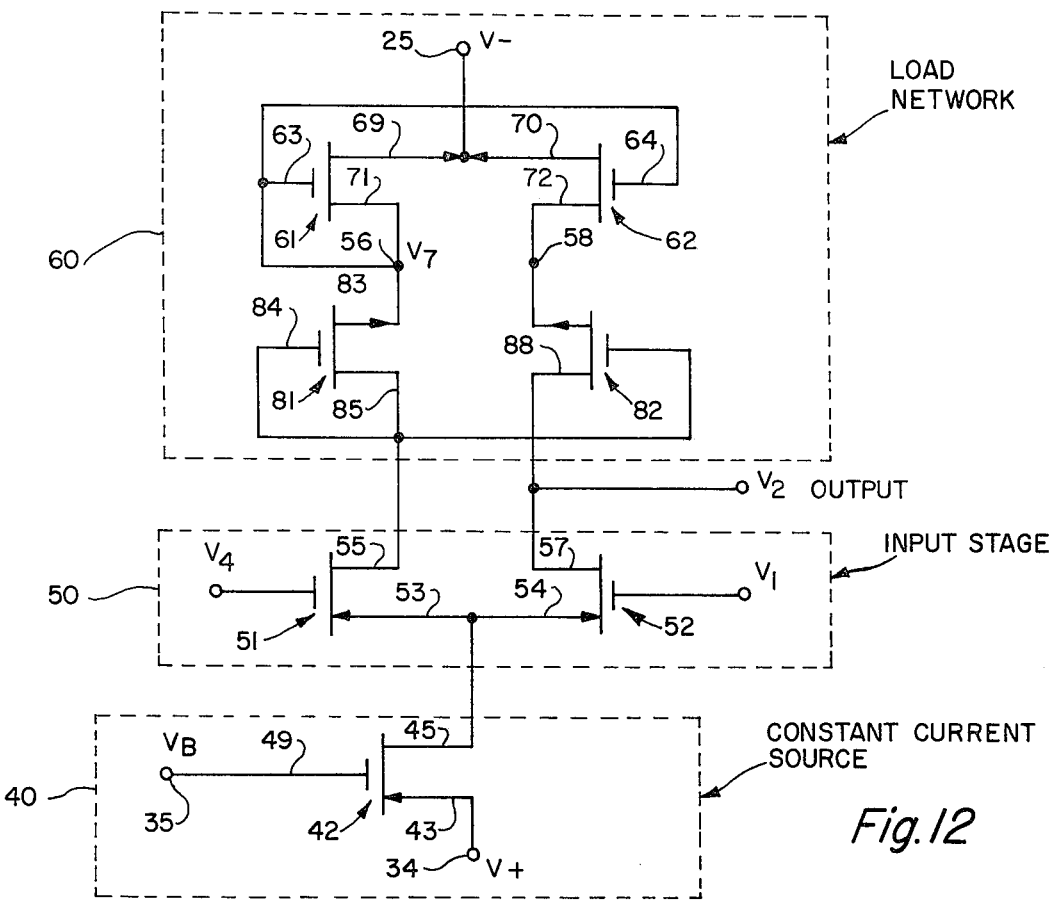
FIG. 12 shows a configuration of a differential amplifier with an unbalanced output configuration.

The differential amplifier shown in FIG. 12 is the same as shown in FIG. 11 except for the elimination of the biasing network 20. The biasing terminal 35 is available for connection to any suitable biasing circuit.

OPERATION OF THE CIRCUIT

FIG. 3 is a circuit schematic of differential amplifier which, with the exception of resistors R1 and R2, utilizes only N and P-channel MOS field effect transistors. The values of R1 and R2 can be within the range from less than 100 kilohms to greater than 1000 megohms without appreciably affecting the performance of the amplifier. The amplifier is designed primarily to operate from a single positive DC supply voltage. However, it can also be operated from two DC power voltages, one positive and one negative. All substrates of P and N-channel MOSFETs are connected to the most positive and most negative nodes in the circuit, respectively.

In reference to FIG. 3, the MOSFETs consisting of transistors 21, 22 and 23 form the DC biasing section 20. Transistors 41 and 42 form a constant current source 40. Transistors 51 and 52 form the input stage 50. Transistors 61 and 62 in combination with the resistors 66 and 68 are the loads for transistors 51 and 52, respectively. In order to insure proper operation of the differential amplifier, three sets of MOSFETs each consisting of three transistors must be reasonably well matched. The first set comprises transistors 23, 41 and 42. The second set comprises transistors 22, 51 and 52. The third set comprises transistors 21, 61 and 62. The gates of transistors 21, 22 and 23 are connected to their respective drains. This guarantees the oepration of these transistors in the saturation region, provided that their gate to source voltages exceed the respective threshold voltages. Transistors 21, 22 and 23 operate together as a voltage divider providing the gate voltage to the transistors 41 and 42 which are connected in parallel. When operated in the saturation region, transistors 41 and 42 act as a constant current source. Each of the transistors 41 and 42 draws a current equal to that drawn by the transistor 23.

The gates, sources and substrates of transistors 61 and 62 are connected together, respectively. Therefore, if a voltage at terminal $V_1$ is set equal to the voltage at terminal $V_4$, then transistors 52, 51 and 62 and 61 draw equal amounts of current thus forcing the voltage at terminals $V_2$ and $V_5$ to be equal.

To insure proper operation of the CMOS differential amplifier, transistors 41 and 42 must operate in the saturation region to provide a high current source with a constant current even with variations in the voltage at $V_3$ due to variations in voltage $V_1$ and $V_4$. Transistors 51 and 52 operate in the saturation region for maintaining linear amplifier performance.

Under ideal conditions, if the voltage at the two input terminals $V_1$ and $V_4$ are set equal, then transistors 51 and 52 and 61 and 62 draw equal amounts of current and the voltage at terminals $V_2$ and $V_5$ is equal. If a positive differential voltage is applied between terminals $V_1$ and $V_4$, that is if the voltage at terminal $V_1$ is at a higher positive potential than the voltage at terminal $V_4$, then transistor 52 wants to draw less current than transistor 51. Since resistors 66 and 68 draw a minimum current due to their extremely large values, then the transistor 62 still draws an equal amount of current as transistor 52 and transistor 61 draws an equal amount of current as transistor 51. The gate to source voltages of transistors 61 and 62 are equal since the two gates and the two sources of these transistors are tied, respectively. In order for transistor 62 to conduct less current, and become consistent with the current drawn in the transistor 52, the drain to source voltage across the transistor 62 is reduced in order for that device sustains a lower current flow. The opposite happens to transistor 61, in which case the drain to source voltage of transistor 61 is increased so that the transistor 61 draws an equal amount of current to that drawn by the transistor 51. As the voltage at terminal $V_1$ goes positive with respect to the voltage at terminal $V_4$, the voltage at terminal $V_4$ approaches the negative voltage and the voltage at terminal $V_5$ approaches the positive voltage. Therefore, there is a phase inversion between the voltages at terminals $V_1$ and $V_2$ and the voltage at terminals $V_1$ and $V_5$ are in phase. By symmetry, the voltages at terminals $V_4$ and $V_2$ are in phase but the voltages at terminals $V_4$ and $V_5$ are out of phase.

Since P-channel MOSFETs 51 and 52 form the two input stages for this amplifier, an extremely large input impedance is expected since the gate to source impedance of the MOSFET is extremely large. With the exception of some gate to source leakage current, the zero input bias and offset currents are characteristic of this circuit. Since MOSFETs exhibit extremely large impedances between their drain and source terminals when operated in the saturation region, the active loads consisting of transistors 61 and 62 provided an extremely large load impedance to transistors 51 and 52, respectively, thus guaranteeing a large voltage gain. The values of the resistors 66 and 68 are made large enough so that they do not effect the gain of the amplifier appreciably. Their values could be anywhere in the range of less than 100 kilohms to several thousand megohms.

Two MOSFETs, 41 and 42, are used for the constant current source 40 in this amplifier. Under ideal conditions, all transistors in this circuit are operating at the same current level when the two input voltages at terminals $V_1$ and $V_4$ are equal. Since transistors 23, 22 and 21 are operating in the saturation region, then for a large range of input common mode voltage, transistors 52 and 51 and 42 and 41 also operate in the saturation region.

The circuit shown in FIG. 3 provides a self-biased differential amplifier. No bias adjustment is necessary, other than an offset adjustment, when an extremely large input common mode voltage swing is expected. Since transistors 23, 22 and 21 continue to operate in the saturation region regardless of the supply voltage magnitude, this circuit, with the exception of the current drain, properly operates independent of the supply voltage variation. The only limitation here is that the supply voltages are large enough to turn the devices on and that they should be small enough so that the devices will not break down. This amplifier configuration provides a balanced output configuration. This feature makes it possible to use the output voltage at $V_2$ and $V_5$ as the input voltages to subsequent differential amplifier stages. The connection of cascaded differential amplifier stages may arise in the design of the high gain operational amplifier or high gain comparator.

It is to be noted that all substrates of all P-channel devices are connected to the most positive supply voltage and, substrates of all N-channel MOSFETs are tied to the most negative supply voltage. It is also to be noted that the amplifier shown in FIG. 3 can operate from a negative input common mode voltage. If the magnitude of the threshold voltage of transistors 52 and 51 exceeds the value of the voltage at $V_2$, then a negative input common mode voltage can be allowed. This feature for the magnitude of the negative input common mode voltage is enhanced by the fact that the substrate of the transistors 52 and 51 are tied to the most positive terminal which is V+, thus providing a back gate bias for the transistors 52 and 51. This increases the threshold voltage to these two transistors.

The bias network 20 of the circuit shown in FIG. 4 differs from that shown in FIG. 3 by the fact that the gate 28 of the transistor 22 is biased independently. Therefore, the voltage at terminal $V_9$ is the bias voltage in this situation. A variation of the voltage at $V_9$ allows one to set the current in the differential amplifier. Transistors 21 and 23 operate in the saturation region. Hence, if the voltage at terminal $V_9$ approaches a small value that results in excessive currents in the transistors 23 and 21, since transistors 23 and 21 are operating in the saturation region, they force transistor 22 to operate in the linear region and hence, they act as current limiters. The voltage at terminal $V_9$ is used as a current adjustment. Since the transistors 62 and 61 each draw half the current of the transistor 42, then as the voltage at terminal $V_9$ is changing, the currents in the transistors 62 and 61 also change. Therefore, the voltages at the terminals $V_2$ and $V_5$ are shifted toward the V+ supply voltage and away from the V− supply voltage depending on the current that is being carried by both the transistors 62 and 61. However, the voltage at the terminals $V_2$ and $V_5$ still remain equal as the voltage at terminal $V_9$ is varied. This is a very desirable feature since the voltage at terminals $V_2$ and $V_5$ are made such that they are compatible to drive a subsequent stage as may be the case in a comparator or an operational amplifier circuit utilizing this amplifier as an input stage. This feature then can be utilized effectively to minimize the offset voltage of such a comparator and operational amplifier design and also in the case of the comparator it could minimize the propagation delay times. In the case of an operational amplifier, it may allow a larger voltage swing than otherwise could be achieved.

In the circuit shown in FIG. 5, the bias current is controlled by varying the value of the resistor 75. The bias current in this network is achieved through the combination consisting of the MOSFET 23 and the resistor 75. As the magnitude of the resistor 75 is varied, the current in the bias network is varied. Since transistors 23 and 42 operate in a current mirror configuration, then the transistor 42 conducts equal current to the value of current flowing in transistor 23. when the value of current flowing in transistors 23 and 42 are made equal, then the variation of the value of the resistor 75 controls the current in the transistor 42 and hence, in the differential amplifier. By putting a fixed value for the resistor 75, as would be the case on an integrated circuit, the range of current that the transistors 23 and 42 conduct are defined depending on the supply voltage variation.

The circuit shown in FIG. 4 allows for a relatively fixed current to flow in the amplifier independent of the process variations that could affect the magnitude of the threshold voltage of the MOSFETs. A variation of the value of the resistor 75, which controls the current flowing in the transistor 42 affects the magnitudes of the voltages at terminals $V_2$ and $V_5$, the same way that the variation of the voltage at terminal $V_9$ did in the previous circuit shown in FIG. 4. Therefore, the level shifting in the voltage levels at terminals $V_2$ and $V_5$ can be used to properly bias a subsequent stage as would be the case in a comparator or operational amplifier. This minimizes the offset and maximizes the voltage swing.

The circuit shown in FIG. 6 is also a balanced differential amplifier. In this configuration, the bias network has been eliminated completely and bias is provided through applying a bias voltage at the gate of transistor 42. A variation of the bias voltage controls the current in the transistor 42 and hence, the current in the differential amplifier. A variation in the $V_B$ bias voltage also controls the magnitude of the voltage at $V_2$ and $V_5$ as was described for the circuit shown in FIGS. 4 and 5, thereby allowing proper comparator and operational amplifier operation. This circuit, however, does not allow any current limiting or any self-bias condition.

The CMOS differential amplifier configurations that are shown schematically in FIGS. 7 through 10 are slightly different than those shown in FIGS. 2 through 6, respectively. The amplifiers shown in FIGS. 7 thorugh 10 are unbalanced type differential amplifiers providing only one single output lat terminal $V_2$. This amplifier, however, requires no resistors and makes it easier to monolithically integrate using standard CMOS monolithic integration technology. If transistor 42 in FIG. 7 were made of two transistors, each identical to that of transistor 23, then the same bias conditions that were described for the circuit of FIG. 3 will apply for the circuit of FIG. 7 under conditions where the voltage at terminals $V_1$ and $V_4$ are equal. The biasing networks of the differential amplifier as shown in FIGS. 7 through 10 are identical to those shown in FIGS. 3 through 6 and are used for the same purposes identically.

The voltage on terminal $V_9$ in FIG. 8 provides the same function as does the voltage on terminal $V_9$ in FIG. 4. However, in FIG. 8, the voltage on terminal $V_2$ is a more sensitive parameter to a variation to the voltage on terminal $V_9$. If transistor 62 is operating in the saturation region, then as the voltage on terminal $V_9$ is varied, the current in transistor 62 also varies. Since transistor 62 is operating in the saturation region, then a large variation in the drain to source voltage of transistor 62 is necessary to affect the change in current that is due to variation in the voltage at terminal $V_9$. Hence, this circuit configuration provides a very effective means of level shifting the output voltage at terminal $V_2$ to make this a more sensitive means of offset adjustment and for improving propagation delay in the cae of a comparator using this for the differential amplifier or maximizing the output voltage swing on an operational amplifier using this amplifier for an input stage also.

The differential amplifier circuit configuration that is shown in FIG. 11 is a modification of the differential amplifier circuits that were shown in FIG. 7 through 10. This circuit is more compatible with operation from a dual supply voltage. This circuit uses one positive and one negative supply voltage. This circuit also provides an output voltage at terminal $V_2$ which is approximately half way between the V+ supply voltage and the V− supply voltage. Under perfect complementary symmetry conditions, the voltage at terminal $V_2$ is made to be at ground potential with equal positive and negative supply voltages. The voltage at terminal $V_9$ of the bias network consisting of transistors 22 and 42 are used effectively as was described previously for the bias voltages at terminal $V_9$ in FIG. 4 and the voltage at terminal $V_8$ in FIG. 7. Both of these voltages control the current in the transistor 42 and hence, the current in the differential amplifier stage and also as an offset voltage adjustment making the voltage at terminal $V_2$ operate at ground potential.

Figure 13:
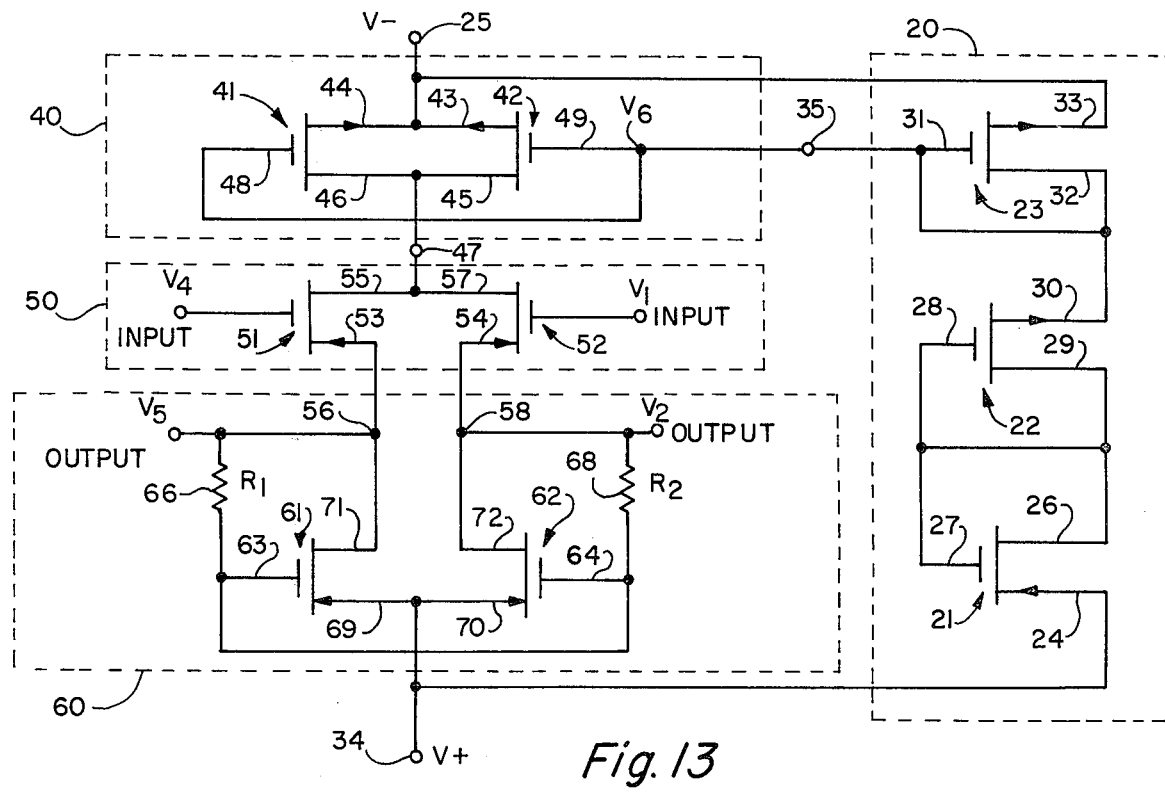
FIG. 13 is a dual circuit of the circuit shown in FIG. 3.

FIG. 12 shows the same differential amplifier circuit configuration of FIG. 11 with the bias voltage applied to the gate of the transistor 42. In this configuration there is no current limiting provision. For all the differential amplifier circuits shown, the constant current source is adjacent to the V+, and the active load is adjacent to V−. This enables the circuits to operate properly with their input common mode voltage from less than V− to two Vsat (the saturation voltage) below B+. In order to have common mode voltage operate around V+, we can interchange V+ and V− and replace all the P-channel MOSFETs with N-channel MOSFETs and all the N-channel MOSFETs with P-channel MOSFETs. This, in fact, constitutes the dual circuits of all the differential amplifier circuits described previously. The dual circuit of FIG. 3 is shown in FIG. 13. The dual circuits for FIGS. 4 to 12 can be constructed in a similar manner when the circuits of FIGS. 3 through 12 are operating with a single power supply voltage. The V− is connected to ground for a single positive power supply, and the V+ terminal is connected to ground for a single negative power supply. Their dual circuits are generated by interchanging the ground terminal and the power supply terminal and by replacing all the P-channel MOSFETs with N-channel MOSFETs and all the N-channel MOSFETs with P-channel MOSFETs. In order to achieve improved current mirror matching with the existing process tolerances a resistor is placed in series with the source electrode of each device in the differential amplifier current source and its current mirror in the biasing network.

While there has been shown and described and pointed out the fundamental novel features of the invention as applied to the preferred and other embodiments, it will be understood that various omissions and substitutions and changes in the form and details of the structural element may be made by those skilled in the art without departing from the spirit of the invention.

What is claimed is:

1. A differential amplifier comprising:
    a. MOSFET constant current source means for setting an operating current level;
    b. differential input means, coupled to said MOSFET constant current source means, having a first input terminal and a second input terminal for receiving two input signals to be compared, said differential input means comprising MOSFET devices of a first conductivity type;
    c. load means comprising MOSFET active load devices of a second conductivity type opposite to said first conductivity type, coupled to said differential input means and coupled to one or more output terminals for producing an output signal responsive to said differential input means, said output terminal having a quiescent operating point determined by said operating current level;
    d. load bias means coupled to said output terminals and said active loads for generating a compensating response to variations in said operating current level to maintain said quiescent operating point while also maintaining balanced operation of said output signal.

2. A differential amplifier as recited in claim 1, and further including:
    a source of potential having at least a first and a second voltage level; and
    a MOSFET biasing network connected between said first and second level of potential for providing a reference voltage;
    said MOSFET constant current source means responsive to said reference from said biasing network for providing a constant current.

3. A differential amplifier as recited in claim 1, wherein said differential input means comprises:
    a first input device having source, drain and gate electrodes;
    a second input device having source, drain and gate electrodes;
    said source electrodes of said first and second input devices being connected together and being coupled to said constant current source means;
    said gate electrode of said first input device being adapted to receive a first input signal to be compared;
    said gate electrode of said second input device being adapted to receive a second input signal to be compared; and
    said first input device and said second input device being MOSFETs of said first conductivity type.

4. A differential amplifier as recited in claim 2, wherein said biasing network comprises:
    an N-channel MOSFET device having source, drain and gate electrodes;
    a first P-channel MOSFET device having source, drain and gate electrodes;
    a second P-channel MOSFET device having source, drain and gate electrodes;
    said source electrode of said N-channel device being connected to said first voltage level;
    said gate electrode of said N-channel device being connected to said drain electrode of said N-channel device and said drain electrode of said first P-channel device and being further connected to said gate electrode of said first P-channel device;
    said source electrode of said first P-channel device being connected to said drain electrode and said gate electrode of said second P-channel MOSFET device;
    said source electrode of said second P-channel device being connected to said second voltage level; and
    said junction of said gate electrode and drain electrode of said second P-channel device furnishing a reference current.

5. A differential amplifier as recited in claim 2, wherein said biasing network comprises:
    an N-channel MOSFET device biasing source, drain and gate electrodes;
    a first P-channel MOSFET device having source, drain and gate electrodes;

said source electrode of said N-channel device being connected to said first voltage level;

said gate electrode of said N-channel device forming a junction with said drain electrode of the same device and that junction being connected to said drain electrode of said first P-channel device;

said gate electrode of said first P-channel device being adapted to receive an input offset and bias adjust signal;

said source electrode of said first P-channel device being connected to the junction of said gate electrode and said drain electrode of said second P-channel device;

said source electrode of said second P-channel device being connected to said second voltage level; and said junction of said gate electrode and drain electrode of said second P-channel device furnishing a reference current.

6. A differential amplifier as recited in claim 2, wherein said biasing network comprises:
a variable resistor having a first and a second terminal, said first terminal being connected to said first voltage level;
a P-channel MOSFET device having source, drain and gate electrodes;
said second terminal of said resistor being connected to a junction of said gate electrode and said drain electrode of said P-channel device;
said source electrode of said P-channel device being connected to said second voltage level; and said junction being a source of reference current.

7. A differential amplifier as recited in claim 2, wherein said biasing network comprises:
a first P-channel device having source, drain and gate electrodes;
a second P-channel device having source, drain and gate electrodes;
said drain electrode of said first P-channel device being connected to ground potential;
said gate electrode of said first P-channel device being adapted to receive an input offset and bias adjust signal;
said source electrode of said first P-channel device being connected to a junction of said drain electrode and said gate electrode of said second P-channel device;
said source electrode of said second P-channel device being connected to said second voltage level; and
said junction being a source of reference current.

8. A differential amplifier as recited in claim 2, wherein said constant current source comprises:
a first P-channel device having source, drain and gate electrodes;
said source electrode being connected to said second voltage level;
said drain electrode connected to said input stage for furnishing a constant current to said input stage; and
said gate electrode of said first P-channel device responsive to the output of said biasing network.

9. A differential amplifier as recited in claim 8, and further including:
a resistor connected in series between said source electrode of said first P-channel device and said second voltage level; and a resistor connected in series between said MOSFET biasing network and said second voltage level.

10. A differential amplifier as recited in claim 8, and further including:
a second P-channel device having source, drain and gate electrodes;
said gate electrode of said second P-channel device being connected to said gate electrode of said first P-channel device;
said drain electrode of said second P-channel device being connected to said drain electrode of said first P-channel device; and
said source electrode of said second P-channel device being connected to said source electrode of said first P-channel device.

11. A differential amplifier as recited in claim 3, and further including:
a source of potential having at least a first and a second voltage level.

12. A differential amplifier as recited in claim 11, wherein said load means comprises:
a first load device having source, drain and gate electrodes;
a second load device having source, drain and gate electrodes;
said source electrode of said first load device being connected to said source electrode of said second load device and to said first voltage level;
said drain electrode of said first load device being connected to said drain electrode of said first input device for forming a first output terminal;
said drain electrode of said second load device being connected to said drain electrode of said second input device for forming a second output terminal;
said gate electrode and said drain electrode of said first load device and said gate electrode and said drain electrode of said second load device each being coupled to said load bias means; and
said first load device and said second load device each being MOSFETs of said second conductivity type.

13. A differential amplifier as recited in claim 12, wherein said load bias means comprises:
a first resistor connected between said gate electrode of said first load device and said drain electrode of said same device;
a second resistor connected between said gate electrode of said second load device and said drain electrode of said same device; and
a conductor connecting said gate electrode of said first load device and said gate electrode of said second load device.

14. A differential amplifier as recited in claim 12, wherein said load bias means comprises:
a. a conductor interconnecting said drain electrode of said first load device, said gate electrode of said same device and said gate electrode of said second load device.

15. A differential amplifier as recited in claim 13, wherein said MOSFET devices of a first conductivity type are P-channel MOSFETs and wherein said MOSFET active load devices of a second conductivity type are N-channel MOSFETs.

16. A differential amplifier as recited in claim 14, wherein said MOSFET devices of a first conductivity type are P-channel MOSFETs and wherein said MOSFET active load devices of a second conductivity type are N-channel MOSFETs.

17. A differential amplifier as recited in claim 16, and further comprising:
- a third N-channel load device having source, drain and gate electrodes;
- a fourth N-channel load device having source, drain and gate electrodes;
- said source electrode of said third N-channel load device being connected to said drain electrode of said first N-channel load device, and said gate electrode of said third N-channel load device being connected to said drain electrode of said first P-channel input device; and
- said source electrode of said fourth N-channel load device being connected to said drain electrode of said second N-channel load device and said gate electrode of said fourth N-channel load device being connected to said drain electrode of said third N-channel load device, and said drain electrode of said third N-channel device being connected to said drain electrode of said P-channel input device.

* * * * *